(12) United States Patent
Richter et al.

(10) Patent No.: US 6,725,407 B2
(45) Date of Patent: Apr. 20, 2004

(54) METHOD AND CONFIGURATION FOR PROTECTING DATA DURING A SELF-TEST OF A MICROCONTROLLER

(75) Inventors: Michael Richter, Ottobrunn (DE); Jan Otterstedt, Unterhaching (DE)

(73) Assignee: Infineon Technologies AG, Munich (DE)

( * ) Notice: Subject to any disclaimer, the term of this patent is extended or adjusted under 35 U.S.C. 154(b) by 21 days.

(21) Appl. No.: 10/105,591

(22) Filed: Mar. 25, 2002

(65) Prior Publication Data

US 2002/0133773 A1 Sep. 19, 2002

Related U.S. Application Data

(63) Continuation of application No. PCT/DE00/03271, filed on Sep. 20, 2000.

(30) Foreign Application Priority Data

Sep. 23, 1999 (EP) .............................................. 99118825

(51) Int. Cl.$^7$ ............................................... G01R 31/28
(52) U.S. Cl. ....................... 714/733; 714/727; 714/729; 714/732; 714/30
(58) Field of Search ................................ 714/7, 10, 26, 714/27, 30, 32, 38, 39, 42, 727, 729, 731–735, 742; 365/200; 380/3, 25, 30, 44

(56) References Cited

U.S. PATENT DOCUMENTS

| 5,349,587 A | * | 9/1994 | Nadeau-Dostie et al. ... 714/729 |
| 5,570,375 A | | 10/1996 | Tsai et al. .................... 714/727 |
| 6,367,042 B1 | * | 4/2002 | Phan et al. ................... 714/733 |
| 6,385,739 B1 | * | 5/2002 | Barton et al. .................. 714/25 |

FOREIGN PATENT DOCUMENTS

| EP | 0 743 602 A1 | 11/1996 |
| EP | 0 798 620 A2 | 10/1997 |

OTHER PUBLICATIONS

Database XP–002135536: "Self Test Method Secure LSSD Chip—Has Scan String Outputs, Clock Outputs, Test Pin Shift Gate Pin Accessible During Wafer Test", Derwent Publications Ltd.

* cited by examiner

Primary Examiner—Emmanuel L. Moise
(74) Attorney, Agent, or Firm—Laurence A. Greenberg; Werner H. Stemer; Gregory L. Mayback

(57) ABSTRACT

The invention relates to a method for protecting data during a self-test of a microcontrollers, in which all of the circuit elements within the microcontroller can be tested, where the course of the self-test cannot be altered via the external pins, and no intermediate results are passed to the outside via the pins. The invention also relates to a configuration in the form of an integrated circuit which can be used to implement the method, and to correspondingly equipped microcontrollers.

35 Claims, 3 Drawing Sheets

METHOD AND CONFIGURATION FOR PROTECTING DATA DURING A SELF-TEST OF A MICROCONTROLLER

CROSS-REFERENCE TO RELATED APPLICATION

This application is a continuation of copending International Application No. PCT/DE00/03271, filed Sep. 20, 2000, which designated the United States.

BACKGROUND OF THE INVENTION

Field of the Invention

The invention relates to a method and a configuration for protecting data during a self-test of a microcontroller. The configuration is in the form of an integrated circuit.

For the manufacture of integrated circuits (ICs), the production test is an aspect that plays a crucial part in the overall determination of the quality. Normally, the production test is performed by stimulating the integrated circuits on a test system using a multiplicity of test patterns on the input pins of the ICs, measuring the test responses on the output pins of the ICs, and comparing them with the nominal values stored in the test system.

This presents a problem for a particular class of ICs, the "security ICs", as are used for data encryption or for the hardware-based protection of transfer protocols, for example. In the case of these ICs, configuration and operation are subject to certain security requirements that—couched in simple terms—require that the internal circuit elements of the IC must not be able to be accessed by unauthorized parties via the pins of the IC. For this reason, the test method outlined cannot be applied in this instance, since knowledge and storage of input data and of the associated nominal output data in a test system or a PC, for example, would allow the configuration and operation of the IC to be inferred. Nevertheless, a suitable production test needs to be conducted for this class of ICs too.

To solve this problem, self-tests (BIST, Built-In Self-Test) have been developed. A self-test normally requires only a start signal to be specified; after a prescribed time, the test response conditioned in the IC can then be read out. Since this test response contains the compression of a large number of individual test results to form a single data record, it is generally not possible for the configuration and operation of the IC to be inferred from this test response.

To implement a self-test, two different approaches can be distinguished for microcontrollers: A self-test containing the execution of a test program stored in the microcontroller itself; and a self-test such as described in IEEE standard 1149.1 "Standard Test Access Port and Boundary-Scan Architecture" under the term "RUNBIST" as an optional function.

The fundamental advantage of a self-test using a test program stored in the microcontroller itself is that the test program can check the authorization to perform the self-test program in a variety of ways before the actual test is performed. This can be done, inter alia, by the external input of a password that is compared with a nominal value stored in the microcontroller, the self-test being started only if the result of the check is positive.

However, the approach using a test program stored in the microcontroller itself generally has substantial drawbacks. One drawback is that software cannot stimulate or observe all of the circuit elements within the microcontroller. The result of this is that the quality of the production test is not sufficiently high. Also, the additionally integrated memory required for the test instructions increases the chip area. Another drawback is that the execution of a test program—as compared with a normal test using a test machine—is generally at least ten times slower.

The approach via the self-test using the boundary scan described in IEEE standard 1149.1, for example, generally solves the problem of the accessibility of internal circuit nodes, since in this case all of the inputs and outputs of the IC are involved in the generation of test patterns and test responses. However, this self-test satisfies only minor security requirements, because the generation of test patterns takes place internally but the test responses are emitted serially by the boundary scan, and the flow control of the self-test by the standardized TAP controller can be altered from the outside at any time. Thus, a "hacker" could misuse this self-test in order to access secrets in the chip. To do so, he would repeat the self-test as often as desired, but would constantly and systematically vary the duration of the self-test by the number of clock cycles which keeps the system in the "Run-Test/Idle" state and would infer the chip content from the results which are then read out in each case. The control signals needed for this are freely accessible externally in line with the IEEE standard, and there is no kind of protection against such "spying".

SUMMARY OF THE INVENTION

It is accordingly an object of the invention to provide a method and configuration for protecting data during a self-test of a microcontroller that overcomes the hereinafore-mentioned disadvantages of the heretofore-known devices of this general type and that allow a full and fast self-test that is protected against hacking attempts.

With the foregoing and other objects in view, there is provided, in accordance with the invention, a method for protecting data while self-testing a microcontroller and testing circuit elements within the microcontroller, a course of the self-test not being alterable via an external pin, and no intermediate results being passed to the outside. The method includes the step of providing the microcontroller with a boundary scan having registers. The next step is storing a built-in self-test (BIST) in the microcontroller. The next step is generating test patterns within the microcontroller with the BIST by using the registers of the boundary scan.

With the objects of the invention in view, there is also provided an integrated circuit configuration for protecting data during a self-test for a microcontroller including devices for starting the self-test and for performing the self-test internally. The self-test covers all fundamental elements of the microcontroller and outputs a corresponding test response. The configuration includes devices for storing a self-test program. In addition, the configuration includes devices for isolating external input and output devices from the devices for performing the self-test throughout execution of the self-test.

Accordingly, the microcontroller has a boundary scan, preferably in line with IEEE standard 1149.1. However, only the obligatory test instructions listed in the IEEE standard are implemented, as are provided for the production test on a printed circuit board (and not on the IC), in line with the intention of the boundary scan.

The BIST now uses the registers of the boundary scan in order to generate pseudo-random test patterns within the chip and to compress test responses. Since the boundary scan register encompasses the entire logic of the chip as far as the input and output cells, it is optimally suited to reaching a maximum number of internal circuit nodes using the self-test, which is in turn a prerequisite for the greatest possible fault coverage and hence quality of the production test.

In accordance with the invention, this BIST is not started directly from the outside (e.g. by the instruction "RUNBIST", as indicated in the IEEE standard), however, but rather with the microcontroller. Beforehand, the microcontroller checks the authorization to perform the self-test. During the self-test, the microcontroller monitors correct execution of the self-test, which includes not allowing the self-test to be interrupted. This also includes not accepting any test instructions during the BIST using the boundary scan (in line with the IEEE standard), that is to say the TAP controller indicated in the IEEE standard is thus decoupled from the boundary scan cells by using logic. At the end of the test, the compressed test response can either be output by the microcontroller or can be compared with a nominal response stored in a read only memory in the microcontroller.

Thus, in principle, the invention combines the two known approaches and the associated logic sequence while preserving the advantages. First, the test program integrated in the microcontroller checks the authorization to execute the self-test. If this condition is satisfied, the test program starts the self-test by decoupling the TAP controller's control signals from the boundary scan register by using logic, putting the test logic into a defined initial state and starting the self-test. At the end of the test, the test program reads the test response stored in the boundary scan register into an internal memory and then erases the test response in the boundary scan register. The TAP controller is then enabled again. The test response stored in the microcontroller can now be compared with a nominal response stored in the test program or can be output to the outside, depending on implementation.

This procedure ensures that only authorized parties can execute the self-test, that the course of the self-test cannot be altered via the external pins, and that no intermediate results are passed to the outside via the pins. Despite this, a fast full self-test covering all of the elements of the microprocessor is made possible.

Other features which are considered as characteristic for the invention are set forth in the appended claims.

Although the invention is illustrated and described herein as embodied in a method and a configuration for protecting data during a self-test of a microcontroller, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
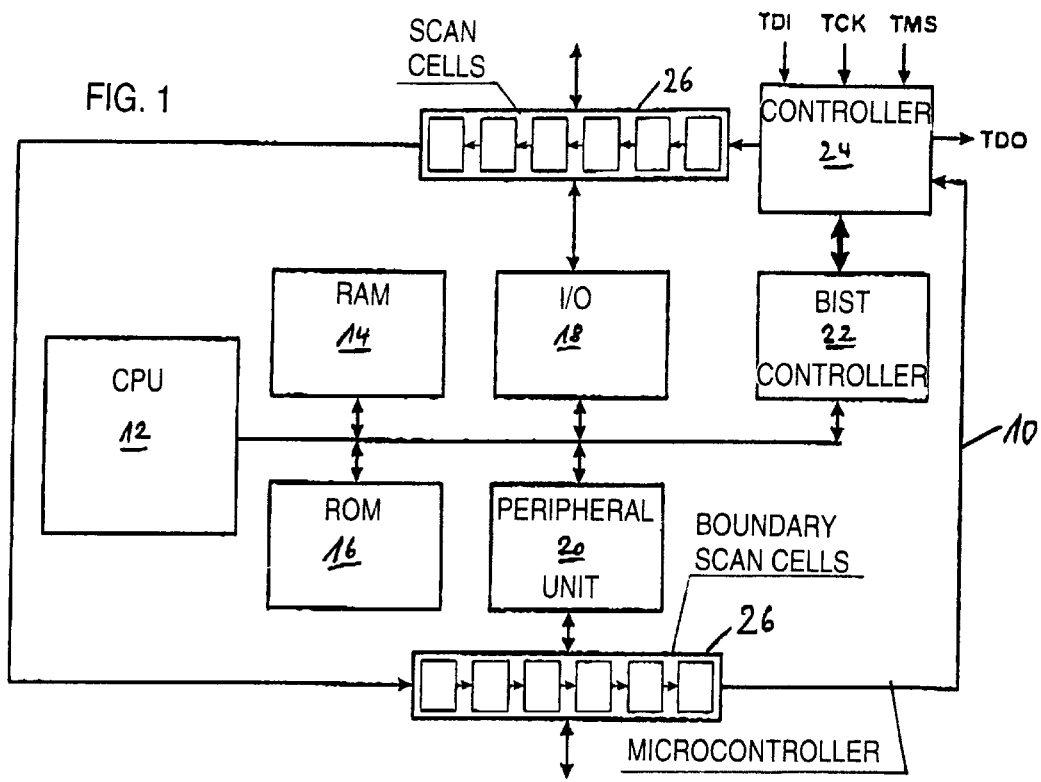
FIG. 1 is a block diagram of a microcontroller according to the invention.

Referring now to the figures of the drawing in detail and first, particularly, to FIG. 1 thereof, there is shown a block diagram of a microcontroller 10 with boundary scan. The microcontroller 10 includes a CPU 12, RAM 14, ROM 16, input/output unit 18, peripheral units (e.g. timers, coprocessors) 20, BIST controller 22, boundary scan TAP controller 24, and boundary scan cells 26. The latter communicate with pads (A in FIGS. 3 and 4) and with a circuit core (B in FIGS. 3 and 4).

Figure 2:
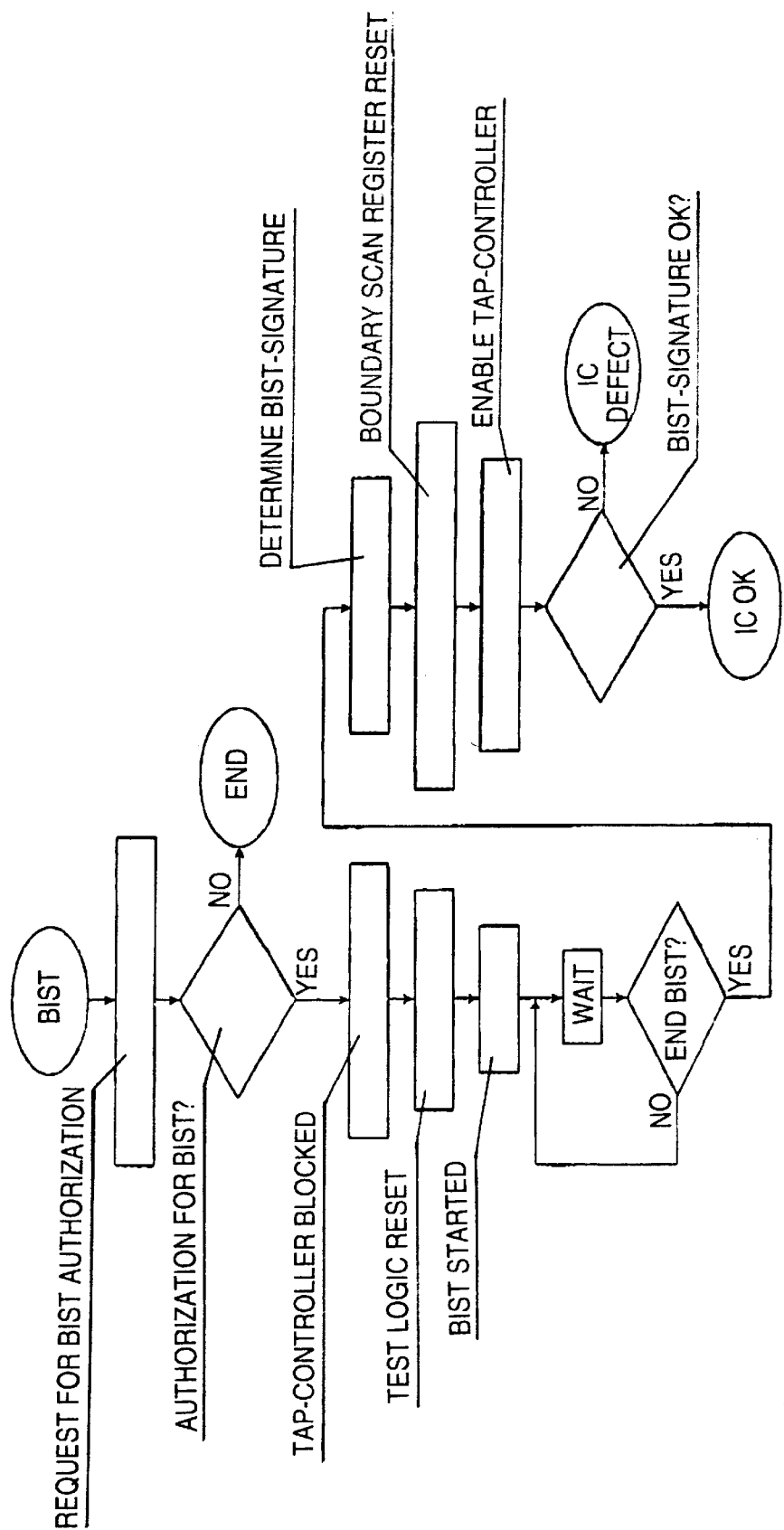
FIG. 2 is a flowchart for describing a preferred embodiment of the invention.

FIG. 2 shows an example of the logical course of the self-test. A request to the microcontroller 10 to start the self-test can be made in various ways: by an external signal, by an instruction transferred to the microcontroller 10, by an internal timer, etc. First, the test program integrated in the microcontroller 10 checks the authorization to execute the self-test. Depending on the form, the check can be conducted by comparing an actual value with a nominal value stored in the microcontroller, by checking a password, by the microcontroller 10 authenticating the external instructing authority (e.g. host computer, test system), or in another suitable manner.

If the check is successful, the TAP controller is blocked, the test logic is reset and the test program starts the self-test. In this regard, it is sufficient for the microcontroller 10 to set a corresponding start bit in the BIST controller 22. Alternatively, an assembler instruction "RUNBIST" is also conceivable which can be executed only if the check is successful, and implicitly starts the BIST controller 22. If the authorization check is not successful, the test program is exited and a reset is triggered, for example.

After the start of the self-test, the microcontroller 10 waits until the hardware of the BIST controller 22 signals the end of the test to the microcontroller 10. This signaling can be conducted in a variety of ways by requesting a status bit in the BIST controller 22, by an interrupt triggered by the BIST controller 22, or by an integrated timer. Next, the BIST signature is ascertained by reading out the boundary scan register to the internal RAM 14. After that, the boundary scan register is reset and the TAP controller 24 is then enabled again. Resetting the boundary scan register makes it impossible for the signature (or parts thereof) to be read out via the TAP controller 24.

The signature can be checked either in the microcontroller 10 itself or externally.

Figure 3:
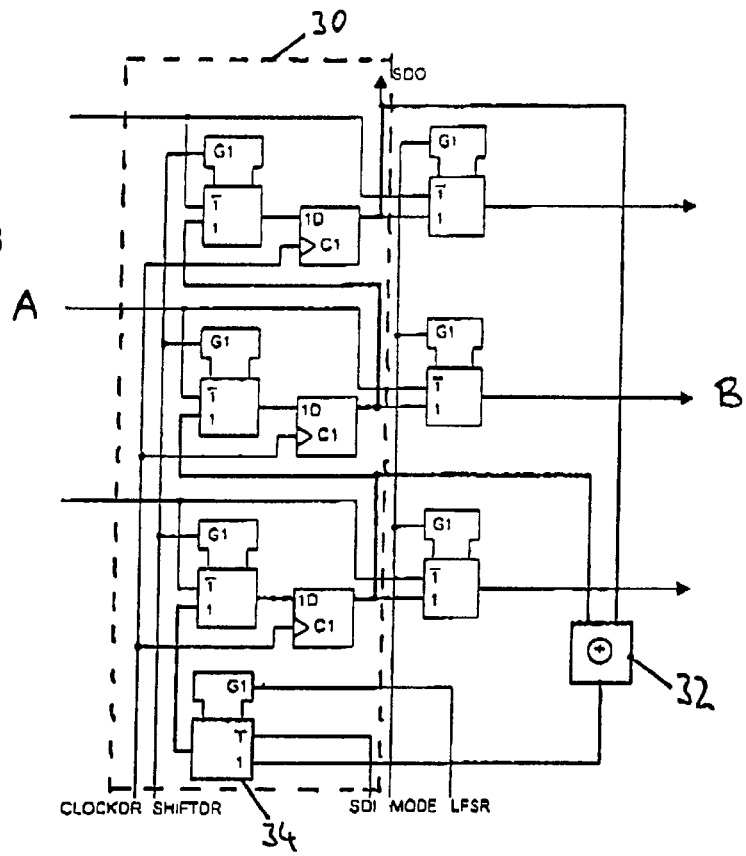
FIG. 3 is a circuit diagram of an input boundary scan cell for producing test patterns.
Figure 4:
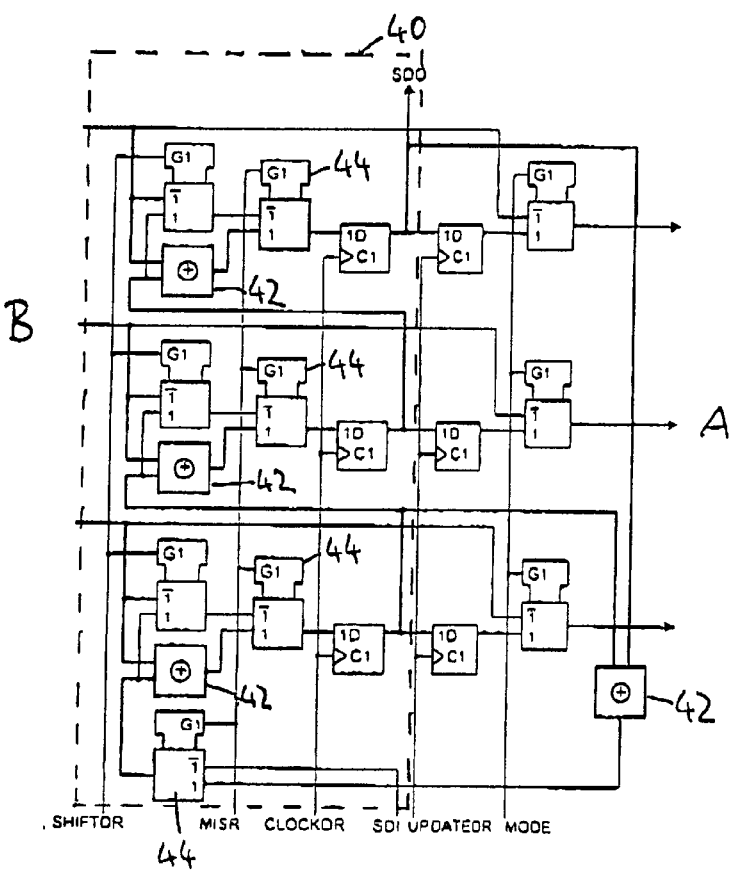
FIG. 4 is a circuit diagram for an output boundary scan cell for holding test responses.

FIGS. 3 and 4 show exemplary implementations of boundary scan register cells 26 used for generating test patterns (FIG. 3) and for evaluating the test responses (FIG. 4).

FIG. 3 shows a 3-bit linear feedback shift register (LFSR) as part of a circuit for an inventive BS cell. Switching elements XOR 32 and a multiplexer 34, additionally inserted in line with the invention, are shown in bold. The signal LFSR is used during the self-test to separate the boundary scan shift register and to generate test patterns using the LFSR. In this case, the signals SHIFTDR and MODE are set to the '1' level. Each clock cycle of the signal CLOCKDR produces a new test pattern.

FIG. 4 shows a 3-bit multiple input signature register (MISR) 40 as an example of a circuit for holding the test responses. The switching elements XOR 42 and multiplexer, additionally inserted in line with the invention, are shown in bold. The signal LFSR is used during the self-test to separate the boundary scan shift register. The MISR 40 sums the test responses from the circuit core. In this case, the signals SHIFTDR and MODE are set to the '1' level. Each clock cycle of the signal CLOCKDR sums another test response. The signal UPDATEDR is blocked by the BIST controller so that no results are passed to the external pins during the self-test.

Figure 5:
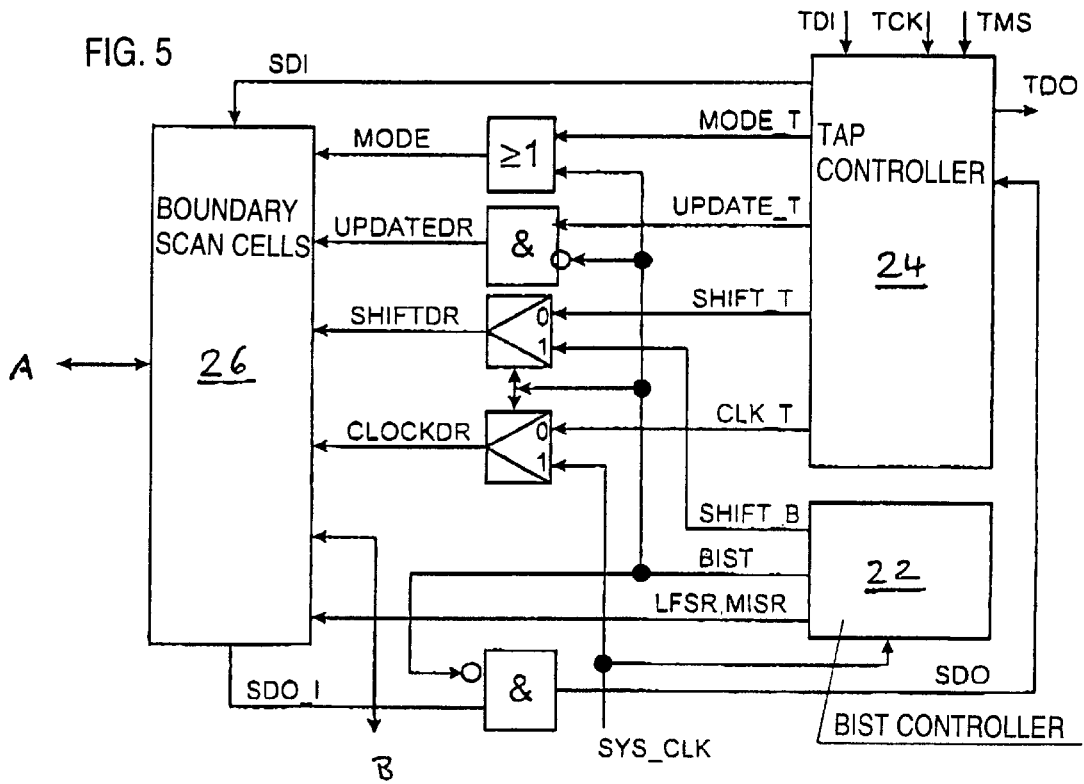
FIG. 5 is a block diagram showing basic flow of signals for the embodiment shown in FIGS. 2 to 4.

FIG. 5 illustrates the flow of signals between the BIST controller 22 and the TAP controller 24 in terms of the control signals derived from the two. The standard-conforming TAP controller 24 is controlled by the external signals TCK (Test Clock), TMS (Test Mode Select), TDI (Test Data Input) and TDO (Test Data Output). The internal control signals (MODE_T, UPDATE_T, SHIFT_T, CLK_T) generated by the TAP controller 24 are blocked by signals from the BIST controller 22 (SHIFT_B, BIST) while the self-test is running.

During the self-test, the BIST controller 22 sets the signals BIST, LFSR, MISR and SHIFT_B. In this case, the BIST controller itself is clocked by SYS_CLK, the system clock of the microcontroller 10.

A signal MODE is held at the '1' level by an OR function, as a result of which the multiplexers 34, 44 actuated by the signal MODE in FIGS. 3 and 4 are set such that no external data are passed to the circuit core (B) via the input pins (A) and would thus be able to manipulate the course of the self-test (FIG. 3), and no (intermediate) test responses can be passed to the output pins (A).

A signal UPDATEDR is held at the '0' level by the AND function with a negated input so that (intermediate) test responses can be passed to the output pins (A) during the self-test.

A signal SHIFTDR is set to the '1' level for the LFSRs 30 in order to form the shift function; for the MISRs 40, the level of this signal is of no significance.

A signal CLOCKDR, used to clock LFSR 30 and MISR 40, is changed over to SYS-CLK, the system clock of the microcontroller 10.

A signal SDO is held at the '0' level by the AND function with a negated input so that no (intermediate) test responses can be passed to the external output TDO of the TAP controller 24 from the boundary scan shift register.

We claim:

1. A method for protecting data while self testing a microcontroller and testing circuit elements within the microcontroller, a course of the self-test not being alterable via an external pin, and no intermediate results being passed to the outside, which comprises the steps of:
   providing the microcontroller with a boundary scan having registers;
   storing a built-in self test (BIST) in the microcontroller; and
   generating test patterns within the microcontroller with the BIST by using the registers of the boundary scan.

2. The method according to claim 1, which further comprises basing the boundary scan on IEEE standard 1149.1, but only implementing obligatory test instructions provided for a production test on a printed circuit board.

3. The method according to claim 2, which further comprises checking with the microcontroller that no test instructions are accepted during the BIST by using the boundary scan according to IEEE standard 1149.1.

4. The method according to claim 3, which further comprises decoupling a TAP controller from the registers of the boundary scan by using logic.

5. The method according to claim 4, which further comprises putting the logic into a defined initial state after the TAP controller has been decoupled from the registers of the boundary scan.

6. The method according to claim 1, which further comprises compressing test responses within the microcontroller with the BIST by using the registers of the boundary scan.

7. The method according to claim 6, which further comprises, after conducting the BIST, comparing the compressed test response with a nominal response stored in read only memory of the microcontroller.

8. The method according to claim 1, which further comprises starting the BIST with the microcontroller.

9. The method according to claim 8, which further comprises not starting the BIST directly from the outside.

10. The method according to claim 1, which further comprises:
    before starting the BIST, checking for an authorization with the microcontroller; and
    not starting the BIST if the authorization is missing.

11. The method according to claim 1, which further comprises monitoring that the BIST correctly executes with the microcontroller.

12. The method according to claim 11, which further comprises preventing interruption of the BIST.

13. The method according to claim 1, which further comprises:
    reading a test response stored in the boundary scan register into an internal memory; and
    then erasing the test response stored in the boundary scan register.

14. The method according to claim 1, which further comprises, after conducting the BIST, outputting a compressed test response with the microcontroller.

15. An integrated circuit configuration for protecting data during a self-test, comprising:
    a microcontroller storing a boundary scan having registers, said microcontroller generating test patterns with the test program by using said registers of said boundary scan;
    devices for starting the self-test and for performing the self-test internally, the self-test covering all fundamental elements of said microcontroller, and for outputting a corresponding test response;
    devices for storing a self-test program; and
    devices for isolating external input and output devices from the devices for performing the self-test throughout execution of the self-test.

16. The configuration according to claim 15, wherein said boundary scan is based on IEEE standard 1149.1, with only obligatory test instructions for a production test being implemented.

17. The configuration according to claim 16, wherein the self-test program stored in said microcontroller is a Built-In Self-Test (BIST).

18. The configuration according to claim 17, wherein said BIST is started by the microcontroller.

19. The configuration according to claim 17, wherein said microcontroller checks an authorization to perform a self-test before starting the BIST.

20. The configuration according to claim 16, including:
    a boundary scan cell equipped with switching elements and multiplexers, and a signal Linear Feedback Shift Register (LFSR) being used during the self-test to separate a boundary scan shift register and to generate said test patterns.

21. The configuration according to claim 20, wherein each clock cycle of a signal produces a new test pattern.

22. The configuration according to claim 20, including a signal Multiple Input Signature Register (MISR) for separating said boundary scan shift register during the self-test and adding test responses from a circuit core.

23. The configuration according to claim 22, wherein each clock cycle of a signal sums another test response.

24. The configuration according to claim 23, including registers of said boundary scan; said BIST controller using said registers of said boundary scan to compress the test responses within said microcontroller.

25. The configuration according to claim 22, including a BIST controller producing signals blocking internal control signals being generated by a TAP controller while the self-test is running, in order to isolate the TAP controller from said boundary scan cells by using logic.

26. The configuration according to claim 25, including a system clock of said microcontroller clocking said BIST controller during the self-test.

27. The configuration according to claim 26, including actuated multiplexers being set such that no external data is passed to a circuit core and no intermediate test responses are passed to output pins of said microcontroller via input pins.

28. The configuration according to claim 27, wherein no intermediate test responses are passed to said output pins of said microcontroller during the self-test.

29. The configuration according to claim 28, wherein a signal is set to a '1' level for said LFSRs in order to form a shift function.

30. The configuration according to claim 29, wherein, during the self-test, a signal used to clock said LFSR and said MISR is changed over to said system clock of said microcontroller.

31. The configuration according to claim 30, wherein said boundary scan shift register passes no intermediate test responses to an external output TDO of said TAP controller.

32. The configuration according to claim 15, wherein said microcontroller monitors correct execution of the self-test.

33. The configuration according to claim 32, wherein said microcontroller monitors that the self-test is not interrupted.

34. The configuration according to claim 16, wherein, after said TAP controller specified in the IEEE standard 1149.1 has been decoupled from said boundary scan cells by using logic, a test logic is put into a defined initial state.

35. A microcontroller, comprising devices for conducting a data-protecting self-test for testing circuit elements within the microcontroller, a course of the self-test not being altered via an external pin, and no intermediate results being passed to the outside; said devices providing a boundary scan having registers, storing a built-in self test (BIST) program, and generating test patterns with the BIST by using the registers of the boundary scan.

* * * * *